United States Patent
Yamada

(10) Patent No.: US 10,241,419 B2
(45) Date of Patent: Mar. 26, 2019

(54) LITHOGRAPHY APPARATUS, PATTERN FORMING METHOD, AND METHOD FOR MANUFACTURING PRODUCT

(71) Applicant: CANON KABUSHIKI KAISHA, Tokyo (JP)

(72) Inventor: Masanori Yamada, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 49 days.

(21) Appl. No.: 15/247,565

(22) Filed: Aug. 25, 2016

(65) Prior Publication Data
US 2017/0075229 A1    Mar. 16, 2017

(30) Foreign Application Priority Data
Sep. 10, 2015   (JP) .................................. 2015-178949

(51) Int. Cl.
*G03F 7/20* (2006.01)
*G03F 7/00* (2006.01)

(52) U.S. Cl.
CPC ........ *G03F 7/70775* (2013.01); *G03F 7/0002* (2013.01); *G03F 7/70483* (2013.01); *G03F 7/70725* (2013.01)

(58) Field of Classification Search
CPC .................................................. G03F 7/70775
See application file for complete search history.

(56) References Cited

U.S. PATENT DOCUMENTS

| 5,798,195 A * | 8/1998 | Nishi | G03F 7/70425 430/22 |
| 6,160,619 A * | 12/2000 | Magome | G03F 7/70716 355/53 |
| 6,495,847 B1 * | 12/2002 | Asano | G03F 7/70716 250/548 |
| 7,230,676 B1 * | 6/2007 | Loopstra | G03F 7/70341 355/30 |

(Continued)

FOREIGN PATENT DOCUMENTS

| CN | 102955377 A | 3/2013 |
| JP | 2002-319541 A | 10/2002 |
| JP | 2007-299983 A | 11/2007 |

*Primary Examiner* — Steven Whitesell Gordon
(74) *Attorney, Agent, or Firm* — Canon U.S.A., Inc. IP Division

(57) ABSTRACT

At least one lithography apparatus that suppresses a decrease in the accuracy of stage control is provided. A lithography apparatus includes a moving unit configured to move with an original or a substrate mounted thereon, a plurality of measurement units configured to obtain information about a position of the moving unit, measurement areas of the respective measurement units overlapping each other, and a control unit configured to switch the measurement units used to obtain the information about the position of the moving unit, based on a switching position lying in an overlapping measurement area, wherein, in a case where a plurality of processes is performed on one of a plurality of processing targets on the original or on the substrate, the control unit makes the switching position changeable and controls the measurement units so that the same one of the measurement units is used in performing the plurality of processes.

14 Claims, 16 Drawing Sheets

(56) References Cited

U.S. PATENT DOCUMENTS

| | | | | |
|---|---|---|---|---|
| 2003/0063289 A1* | 4/2003 | Inoue | ............... | G03F 7/70725 356/500 |
| 2003/0165265 A1* | 9/2003 | Kurosawa | ........... | G03F 7/70725 382/145 |
| 2003/0234939 A1* | 12/2003 | Kurosawa | ........... | G03F 7/70725 356/500 |
| 2005/0219486 A1* | 10/2005 | Korenaga | ........... | G03F 7/70641 355/53 |

* cited by examiner

LITHOGRAPHY APPARATUS, PATTERN FORMING METHOD, AND METHOD FOR MANUFACTURING PRODUCT

BACKGROUND OF THE INVENTION

Field of the Invention

The present disclosure relates to a lithography apparatus, a pattern forming method, and a method for manufacturing a product.

Description of the Related Art

Lithography apparatuses for forming a pattern on a substrate are used to manufacture semiconductor devices and flat panel displays. Examples of the lithography apparatuses include an exposure apparatus and an imprint apparatus. High productivity and miniaturization technique are demanded of lithography apparatuses. A stage which is driven with a substrate or an original mounted thereon accordingly needs to be driven at a high speed and with high accuracy. For high-speed and high-accuracy stage control, the position of the stage is measured by using a high-resolution laser interferometer and a reflecting mirror that serves as a target of the laser light and has a flatness of high accuracy. As the driving range of the stage increases, the reflecting mirror increases in length. This has caused issues such as a difficulty in achieving a flatness of high accuracy and an increase in cost.

As an approach to address such issues, Japanese Patent Application Laid-Open No. 2002-319541 discusses a technique for performing position measurement by switching a plurality of laser interferometers. According to Japanese Patent Application Laid-Open No. 2002-319541, a plurality of laser interferometers is used and switched in an area where the plurality of laser interferometers can simultaneously make a measurement. In such a manner, position measurement and position control across the entire driving range of the stage are achieved.

A lithography apparatus performs a focus measurement process in a Z direction to obtain a focus offset before performing a process on a substrate. The lithography apparatus also performs an alignment measurement process in X and Y directions to obtain alignment offsets. The lithography apparatus then reflects the obtained focus and alignment offsets on stage control and performs the process on the substrate. If the focus measurement process in the Z direction is performed by using a plurality of laser interferometers, a position to switch the laser interferometers is determined in a coordinate system of stage driving. With the alignment offsets reflected on the stage control, the same processing target (for example, shot) may thus be measured by using different laser interferometers in the focus measurement process and in the process on the substrate.

In a case where the same process is performed on the same substrate for a plurality of times, the same processing target may be measured by using different laser interferometers. For example, if the alignment measurement process is performed for a plurality of times, the stage may be driven in different directions in the plurality of processes depending on the position of the stage when the previous process ends. Thus, even the same processing target (for example, alignment mark) may thus be measured by using different laser interferometers.

Further, in a case where the same process is performed on different substrates having the same shot layout, corresponding processing targets at the same positions on the substrates may be measured by using different laser interferometers. For example, in a case where the alignment measurement process is performed on corresponding alignment marks, the alignment marks on the different substrates may be measured by using different laser interferometers depending on a difference in the amount of positional deviation between each substrate and the substrate stage and a difference in the driving direction of the substrate stage.

Laser interferometers and reflecting mirrors have unique characteristics due to manufacturing errors. Depending on the unique characteristics, the same target measured by different interferometers may produce errors in the measurement result. Such measurement errors change the characteristic of the stage control.

Consequently, if a plurality of processes is performed on the same processing target or corresponding processing targets, the use of different laser interferometers for the stage control may cause a change in the characteristic of the stage control to decrease the accuracy of the stage control.

SUMMARY OF THE INVENTION

The present disclosure is directed to a lithography apparatus, a pattern forming method, and a method for manufacturing a product that are capable of suppressing a decrease in the accuracy of the stage control.

According to an aspect of the present disclosure, a lithography apparatus that forms a pattern on a substrate is provided, the lithography apparatus including a moving unit configured to move with an original or the substrate mounted thereon, a plurality of measurement units configured to obtain information about a position of the moving unit, measurement areas of the respective measurement units overlapping each other, and a control unit configured to switch the measurement units used to obtain the information about the position of the moving unit, based on a switching position lying in an overlapping measurement area, wherein, in a case where a plurality of processes is performed on one of a plurality of processing targets on the original or on the substrate, the control unit makes the switching position changeable and controls the measurement units so that the same one of the measurement units is used in performing the plurality of processes.

According to other aspects of the present disclosure, one or more additional lithography apparatuses, one or more pattern forming methods, and one or more methods for manufacturing a product are discussed herein. Further features of the present disclosure will become apparent from the following description of exemplary embodiments with reference to the attached drawings.

DESCRIPTION OF THE EMBODIMENTS

Figure 1:
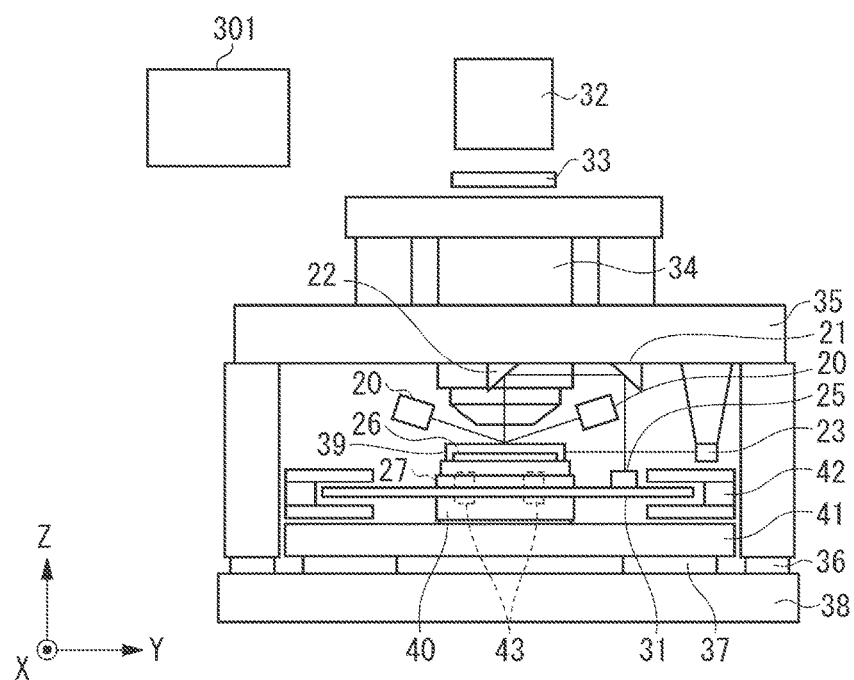
FIG. 1 is a diagram illustrating a configuration of an exposure apparatus.

Exemplary embodiments of the present disclosure will be described in detail below with reference to the drawings. The following exemplary embodiments deal with examples where an exposure apparatus is used as a lithography apparatus. In the drawings, similar members are designated by the same reference numerals. A redundant description thereof will be omitted.

A first exemplary embodiment will be described below. FIG. 1 is a diagram illustrating a configuration of an exposure apparatus. The exposure apparatus according to the present exemplary embodiment includes a light source unit (not illustrated). Examples of a light source include a high pressure mercury lamp and an excimer laser. If the light source is an excimer laser, the light source unit is not necessarily inside a chamber of the exposure apparatus but can be externally attached to the apparatus. Light emitted from the light source unit illuminates a not-illustrated reticle (original or mask) via an illumination unit 32. The reticle has a pattern to be transferred onto a wafer (substrate) to which a photosensitive material is applied. The reticle is mounted on a reticle stage 33 (moving unit). The reticle stage 33 sucks and holds the reticle via a reticle chuck (not illustrated). For example, the reticle stage 33 is configured to be movable by a linear motor (not illustrated).

A projection unit 34 projects the pattern drawn on the reticle onto a wafer (not illustrated) placed on a wafer chuck 26. The projection unit 34 is supported by a barrel support 35. Main body active mounts 36 support the barrel support 35 while suppressing vibrations. The main body active mounts 36 also blocks vibration from the floor. The main body active mounts 36 and stage active mounts 37 are installed on a positioning surface plate 38.

A focus sensor 20 includes a light projection system for projecting light (a plurality of beams) on the wafer, a light reception system for receiving reflection light from the wafer, and a detection unit that detects the light from the light reception system and outputs a detection signal to a control unit 301. The light projection system and the light reception system are arranged, in a Y direction, with a vicinity of an emission part of the projection unit 34 therebetween. The light projection system irradiates the wafer with oblique incident light, and the light reception system captures the reflected light on the opposing side. The control unit 301 determines a displacement amount of the wafer in a Z direction based on the detection signal obtained by the focus sensor 20.

Fixed mirrors 21 and 22 are mirrors intended for measurement in the Z direction. The fixed mirrors 21 and 22 are fixed to the barrel support 35. A moving mirror 39 attached onto a top stage 27 includes two reflection surfaces, integrating a mirror 30 intended for measurement in the Z direction and a mirror 29 intended for measurement in an X direction.

An X stage 31 is movable in the X direction. A Y stage 40 is movable in the Y direction. A stage surface plate 41 supports the Y stage 40 and the X stage 31. The stage active mounts 37 suppress vibrations of the stage surface plate 41, which occur due to the movement of the X stage 31 and the Y stage 40, and blocks vibration from the floor. The X stage 31 and the Y stage 40 are supported by the stage surface plate 41 via hydrostatic bearings (not illustrated) in such a manner that the X stage 31 and the Y stage 40 are not in contact with the stage surface plate 41.

X linear motors 42 are stage-driving linear motors for moving the X stage 31 in the X direction. Movers of the X linear motors 42 are arranged on the X stage 31, and stators of the X linear motors 42 are arranged on the stage surface plate 41. The stators may be supported on the stage surface plate 41 via hydrostatic bearings (not illustrated) in such a manner that the stators are not in contact with the stage surface plate 41. Alternatively, the stators may be fixed to the stage surface plate 41. There are also provided stage-driving Y linear motors (not illustrated) for moving the Y stage 40 in the Y direction. Movers of the Y linear motors are arranged on the Y stage 40, and stators thereof are arranged on the X stage 31, thereby generating a driving force in the Y direction between the X stage 31 and the Y stage 40.

The top stage 27 is mounted on the Y stage 40. The top stage 27 can be finely moved with respect to the Y stage 40 by an actuator (not illustrated). A laser interferometer 23 is a laser interferometer for measuring a relative position in the Y direction between the barrel support 35 and the top stage 27 on which the wafer is mounted, and for measuring an attitude of the top stage 27. Similarly, there is provided a laser interferometer 24 (not illustrated in FIG. 1, see FIG. 2) for measuring a relative position in the X direction between the barrel support 35 and the top stage 27 and for measuring the attitude of the top stage 27. Further, a laser interferometer 25 for measuring a relative position in the Z direction between the barrel support 35 and the top stage 27 is fixed to the X stage 31. The laser interferometer 25 measures a distance to the moving mirror 39 from the X stage 31 via the fixed mirrors 21 and 22. The position of the top stage 27 can also be measured by using Z displacement sensors 43 that are arranged in the Y stage 40. The Z displacement sensors 43 are displacement sensors provided separately from the laser interferometer 25. Examples of the Z displacement sensors 43 include a linear encoder and a capacitance sensor. The Z displacement sensors 43 measure displacements of the top stage 37 with respect to the Y stage 40 at three locations, and thus can measure displacements of the top stage 27 in the Z direction and tilt directions. It should be noted that two of the three Z displacement sensors 43 are illustrated in FIG. 1. The other one Z displacement sensor 43 is not illustrated.

The wafer chuck 26 is mounted on the top stage 27 and holds the wafer. The top stage 27 positions the wafer chuck 26 in the Z direction, a θ direction, an ωX direction, and an ωY direction.

The wafer held by the wafer chuck 26 is thus moved by driving of the X stage 31, the Y stage 40, the top stage 27, and the wafer chuck 26. The X stage 31, the Y stage 40, the top stage 27, and the wafer chuck 26 will be collectively referred to as a wafer stage (moving unit). The configuration of the moving unit is not limited to the aforementioned configuration.

The control unit 301 is an information processing apparatus such as a computer, and includes a central processing unit (CPU), a memory, and so on. The control unit 301 controls various units and devices of the exposure apparatus and performs various arithmetic operations. The control unit 301 may be configured of a plurality of information processing apparatuses.

Figure 2:
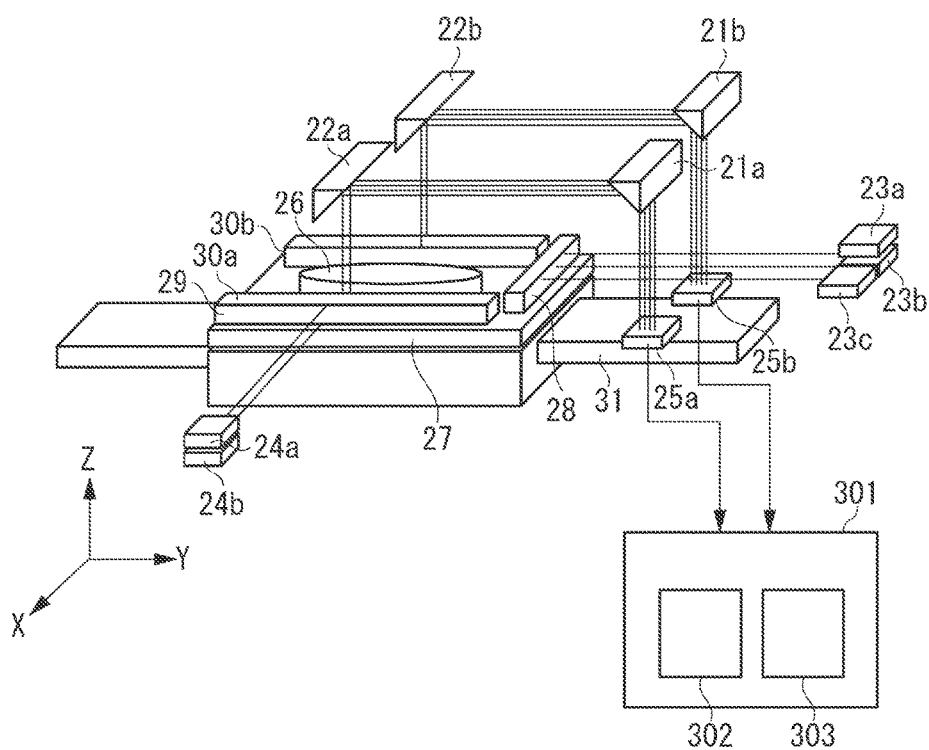
FIG. 2 is a diagram illustrating a configuration in which a plurality of measurement units is arranged.

FIG. 2 is a diagram illustrating a configuration in which a plurality of measurement units is arranged. In the present exemplary embodiment, two laser interferometers that can measure an overlapping area are used to measure a stage position in the single direction (Z direction).

Interferometers 25a and 25b are two interferometers for measuring the stage position in the Z direction. The interferometers 25a and 25b are both mounted on the X stage 31. The laser interferometers 25a and 25b are arranged so that beams emitted from the laser interferometers 25a and 25b are perpendicular to an XY plane. Alternatively, the beams are guided to be perpendicular by optical elements such as a mirror. In the present exemplary embodiment, the beams emitted from the laser interferometers 25a and 25b are respectively made incident on mirrors 30a and 30b each having a reflection surface parallel to the XY plane via fixed mirrors 21a, 21b, 22a, and 22b, whereby the position of the top stage 27 in the Z direction is measured. Herein, a first measurement unit includes the fixed mirrors 21b and 22b and the mirror 30b that form a laser light beam path of the laser beam emitted from the laser interferometer 25b, and the laser interferometer 25b. A second measurement unit includes the fixed mirrors 21a and 22a and the mirror 30a that form a laser light beam path of the laser beam emitted from the laser interferometer 25a, and the laser interferometer 25a. Each measurement unit detects a change in the path length of the laser light beam path to obtain information about the position of the top stage 27 (reflection surface of the mirror 30a or 30b), such as the position in the Z direction, speed, and acceleration.

In the control unit 301, a CPU 302 obtains measurement values from the first measurement unit and the second measurement unit, and stores the measurement values in a memory 303 (storage unit). The CPU 302 performs a switching control between the first measurement unit and the second measurement unit according to the position of the top stage 27 in the X direction. In this way, the position of the top stage 27 in the Z direction can be measured while avoiding obstacles that blocks measurement light of a lens barrel of the projection unit 34. In the switching control, the control unit 301 passes a measurement value from the measurement unit by which the CPU 302 has made measurements so far to the measurement unit by which the CPU 302 is going to make measurements. The position of the top stage 27 at which the measurement values are switched lies in a measurement area where the two laser interferometers 25a and 25a are both able to make a measurement (overlapping measurement area). By appropriately switching the measurement units, the CPU 301 constantly outputs a measurement value of the position of the top stage 27 in the Z direction.

Figure 3:
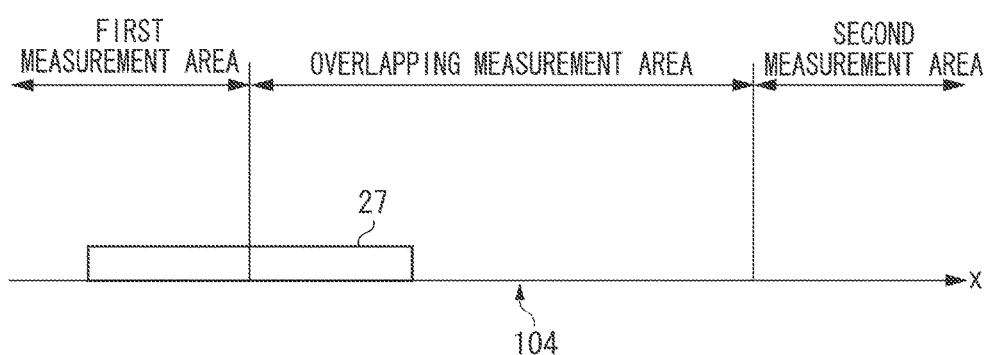
FIG. 3 is a diagram illustrating measurement areas and a switching position of the measurement units.

FIG. 3 is a diagram illustrating the measurement areas and the switching position of the measurement units. The driving range of the top stage 27 in the X direction is divided into measurement areas. A first measurement area is an area where only the first measurement unit makes a measurement. An overlapping measurement area is an area where both the first measurement unit and the second measurement unit can make a measurement. A second measurement area is an area where only the second measurement unit makes a measurement. The first measurement unit and the second measurement unit are switched when an arbitrary position of the top stage 27 passes through a switching position 104. Examples of the arbitrary position of the top stage 27 include a left end, a center, and a right end of the top stage 27. Suppose that the arbitrary position of the top stage 27 is the right end. In FIG. 3, the right end of the top stage 27 is located at a position in a −X direction with respect to the switching position 104. Thus, FIG. 3 illustrates a state where the first measurement unit is being used for measurement. If the top stage 27 is driven in a +X direction and the right end of the top stage 27 passes through the switching position 104, the first measurement unit is switched to the second measurement unit. While the elements constituting the wafer stage, such as the X stage 31, are also driven, FIG. 3 illustrates only the top stage 27 for the sake of simplicity.

Figure 4:
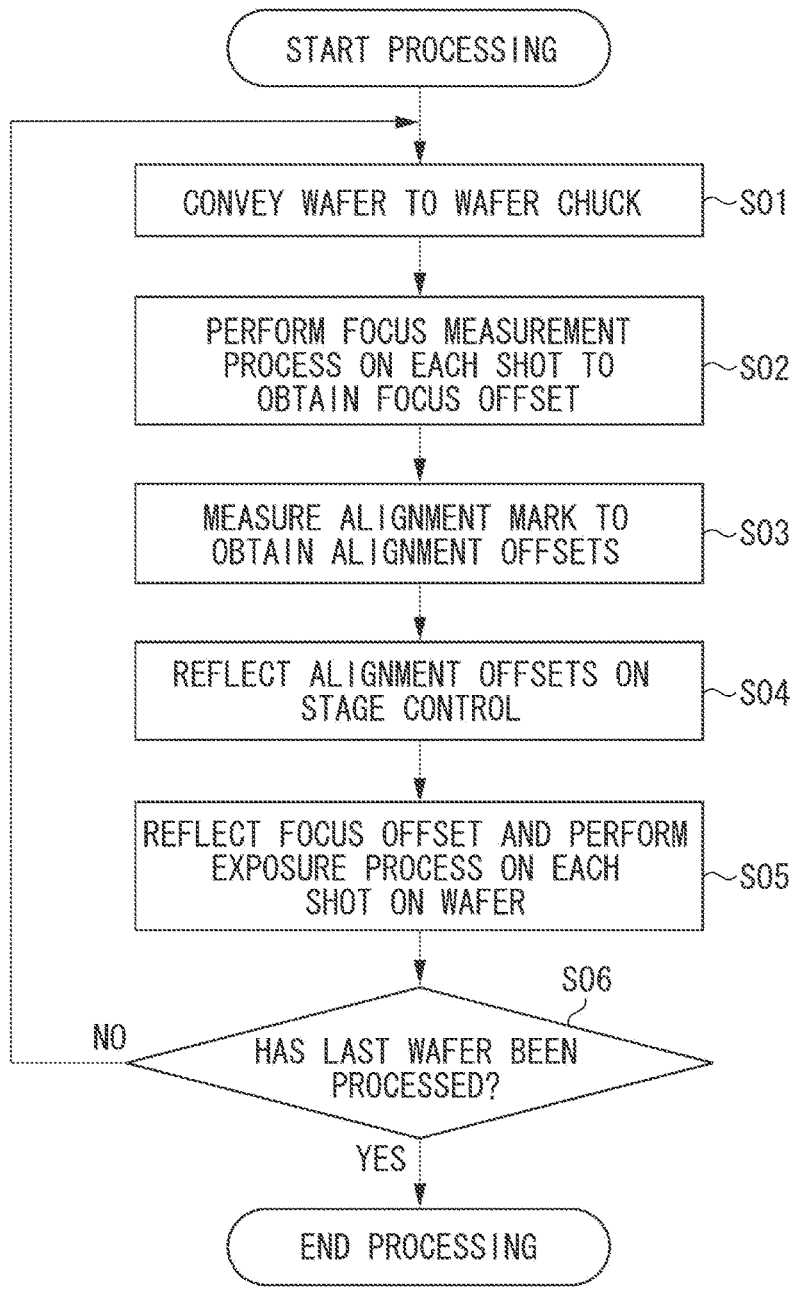
FIG. 4 is a flowchart of exposure process processing.

FIG. 4 is a flowchart of exposure processing. In the present exemplary embodiment, processing targets on the substrate are described as shots. In step S01, a wafer to which a photosensitive material is applied is conveyed to the wafer chuck 26 by a conveyance hand (not illustrated). As described above, the wafer chuck 26 is mounted on the top stage 27. The wafer chuck 26 is attached so that its origin coincides with that of the top stage 27. However, in fact, there may be an error between the origins.

In step S02, a focus measurement process is performed in the Z direction on each shot on the conveyed wafer to obtain a focus offset. At this time, to make measurements shot by shot, the wafer stage is driven via the same paths as in an exposure process (substrate process) for exposing the substrate to the pattern of the reticle.

In step S03, alignment offsets of the conveyed wafer in the X and Y directions are obtained. As employed herein, the alignment offsets refer to the offsets of each wafer for adjusting deviations between the stage origin and the wafer origin in the X direction, the Y direction, and a θZ direction. Alignment marks with respect to the shots may be measured to obtain the alignment offsets of each shot for adjusting deviations of the shot origin in the X, Y, and θZ directions. Steps S02 and S03 may be performed in parallel.

Figure 5:
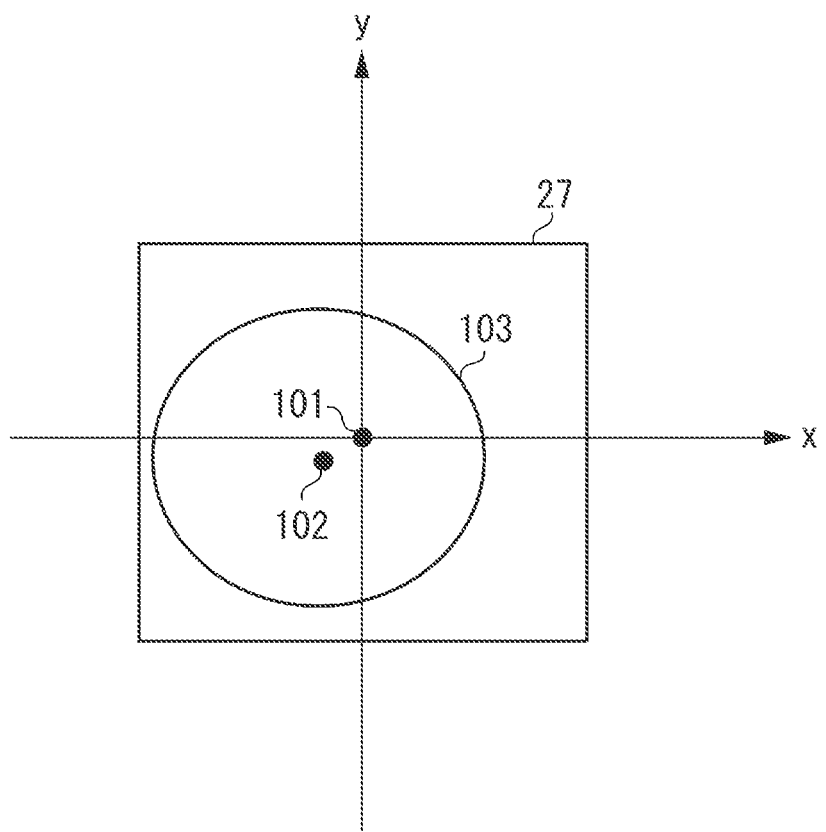
FIG. 5 is a diagram illustrating a positional relationship between a wafer and a top stage.

FIG. 5 is a diagram illustrating a positional relationship between a wafer and the top stage 27. The stage origin and the origin of a lens (projection lens; not illustrated) of the projection unit 34 are typically positioned to each other upon startup of the exposure apparatus. If a wafer origin 102 of a wafer 103 placed on the wafer chuck 26 (not illustrated in FIG. 5) coincides with a stage origin 101 of the top stage 27, the alignment offsets are zero. In fact, as illustrated in FIG. 5, the wafer origin 102 and the stage origin 101 do not coincide due to the foregoing errors of the origins of the wafer chuck 26 and the top stage 27 and errors occurring from the conveyance of the wafer 103. For the sake of clarification, FIG. 5 illustrates the stage origin 101 and the wafer origin 102 to have a large deviation. The deviation usually is small.

Before the exposure process, the control unit 301 then not only obtains the focus offset but measures the alignment mark formed on the wafer as well to measure relative deviations in the X and Y directions. The alignment mark on the wafer is measured under an alignment scope (not illustrated in FIG. 1; see FIG. 9 to be described below). The alignment scope is a microscope including an off-axis optical system that has an optical axis off that of the projection lens. A through-the-lens (TTL) microscope for performing measurement through the projection lens may be used as the alignment scope.

Referring back to FIG. 4, in step S04, the obtained alignment offsets are reflected on control of the wafer stage (stage control). This enables stage control with reference to the wafer origin 102.

In step S05, the focus offset obtained in step S02 are reflected and an exposure process is performed on each shot on the wafer.

In step S06, whether the last wafer has been processed is determined. If the last wafer has been processed (YES in step S06), the processing ends. If the last wafer has not been processed (NO in step S06), the processing returns to step S01 and the next wafer is conveyed.

Figure 6:
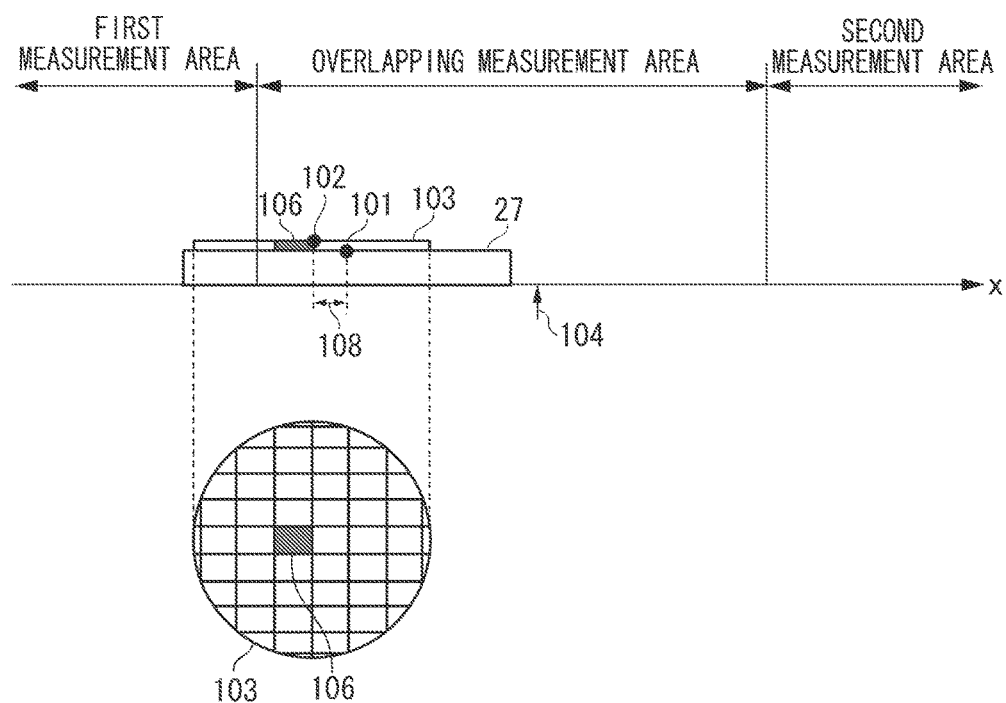
FIG. 6 is a diagram illustrating a stage position in a focus measurement process.

FIG. 6 is a diagram illustrating a stage position in the focus measurement process. Similar to FIG. 3, the upper part of FIG. 6 illustrates the first measurement area, the overlapping measurement area, the second measurement area, and the switching position 104 in the X direction. The upper part of FIG. 6 further illustrates the top stage 27 and the wafer 103 in cross sections, and illustrates the stage origin 101, the wafer origin 102, and a shot 106 laid out on the wafer 103. An amount of deviation 108 represents the amount of deviation in the X direction between the stage origin 101 of the top stage 27 and the wafer origin 102 of the wafer 103. The amount of deviation 108 serves as the alignment offset in the X direction. The lower part of FIG. 6 illustrates a top view of the wafer 103, illustrating the position of the shot 106. The focus measurement process on the shot 106 is performed with the top stage 27 in the position illustrated in FIG. 6. Since the top stage 27 here is located in the −X direction of the switching position 104, the first measurement unit is used to measure the stage position in the Z direction. The top stage 27 is driven in a coordinate system with reference to the stage origin 101.

Figure 7:
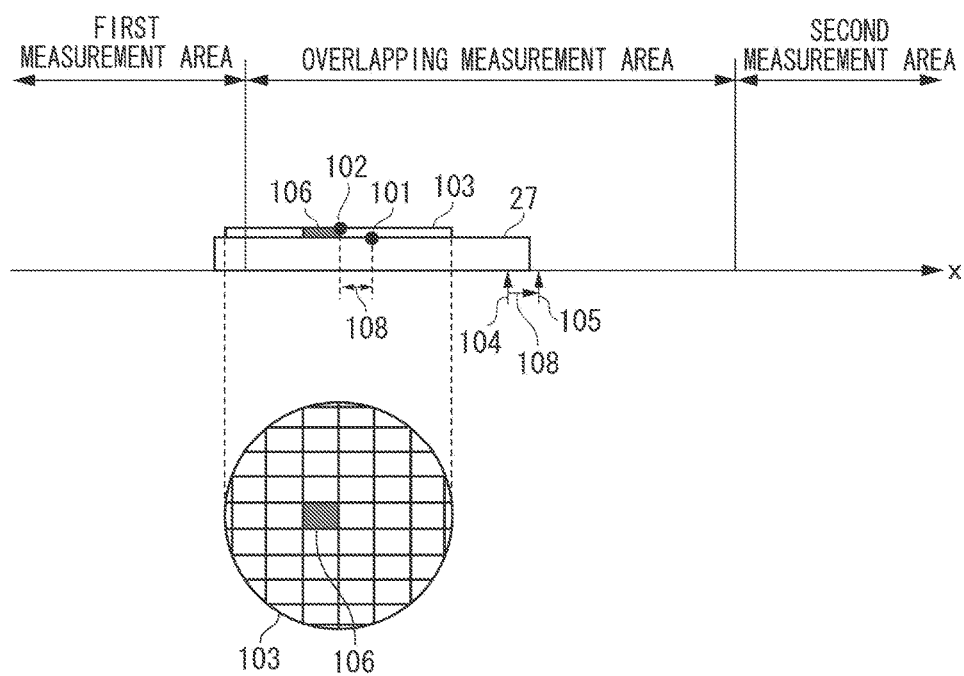
FIG. 7 is a diagram illustrating a stage position when the switching position is changed.

FIG. 7 is a diagram illustrating a stage position when the switching position is changed. The same reference numerals as in FIG. 6 will be used. An exposure process on the shot 106 is performed with the top stage 27 in the position illustrated in FIG. 7. Since the alignment offsets are reflected on the stage control, the top stage 27 is driven in a coordinate system with reference to the wafer origin 102. As compared to the case of FIG. 6, the position of the top stage 27 is shifted in the +X direction by the amount of deviation 108. In other words, the position of the top stage 27 changes by the alignment offsets between during the offset measurement and during the exposure process of the shot 106. The switching position 104 is then made changeable so that the measurement unit used in the focus measurement process of a shot and the measurement unit used in the exposure process of the shot are the same. In step S04 of FIG. 4, when the alignment offsets are reflected on the stage control, the switching position 104 is changed to a position shifted by the amount of deviation 108. More specifically, the switching position 104 is changed to a switching position 105 shifted by the amount of deviation 108 in the +X direction. Since the top stage 27 here is located in the −X direction of the switching position 105, the first measurement unit is used to measure the stage position in the Z direction. The measurement unit used in the focus measurement process of the shot 106 and the measurement unit used in the exposure process of the shot 106 are therefore the same. The switching position 104 is made changeable so that the same measurement unit is used in the focus measurement process and the exposure process with respect to all of the shots, similar to the shot 106. While the top stage 27 is described to move in the +X direction, the top stage 27 may move in the −X direction, in which case the switching position is shifted in the −X direction. If the alignment offsets are obtained of each shot on the wafer 103 in step S05 of FIG. 4, the switching position may be changed by the alignment offsets of the shot as well as the amount of deviation 108 before the shot is exposed.

Figure 8:
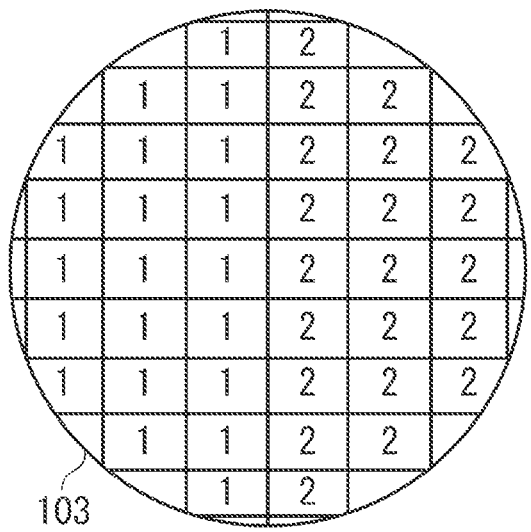
FIG. 8 is a diagram illustrating the numbers of the measurement units that measure respective shots.

FIG. 8 is a diagram illustrating the numbers of the measurement units that measure the respective shots. Shots marked with "1" represent ones measured by the first measurement unit. Shots marked with "2" represent ones measured by the second measurement unit. As described above, the switching position between the measurement units is changed so that the measurement unit used in the focus measurement process of each shot and the measurement unit used in the exposure process of the shot are the same. As indicated by the numbers of the measurement units on the respective shots in FIG. 8, if the focus measurement process and the exposure process of a plurality of shots are performed, each single shot is processed by using the same one of the measurement units.

Information about the measurement units used for the respective shots may be managed and the switching position may be changed so that each single shot is processed by using the same measurement unit. In step S02 of FIG. 4, the control unit 301 stores the information about the measurement unit used in the focus measurement process of each shot in the memory 303. In step S05 of FIG. 4, the control unit 301 reads the information about the used measurement units from the memory 303 shot by shot, and changes the switching position so that the same measurement units are used in the exposure process.

In the foregoing description, the first and second, two measurement units are used. However, the present exemplary embodiment is not limited to two measurement units and may be applied when there is configured a plurality of measurement units. The measurement units are described to use the laser interferometers. However, other sensors such as a linear encoder and a capacitance sensor may be used.

The processes that use the same measurement units are described to be the focus measurement process and the exposure process. However, the processes are not limited thereto. For example, if the exposure process is followed by a process for driving the wafer stage to measure the result of the exposure process of each shot (process for measuring a result of the substrate process), the measurement units to be used may be similarly made the same for improved accuracy of the measurement result.

If a plurality of processes is performed, the processes on one processing target use the same measurement unit for stage control. This can suppress a decrease in the accuracy of the stage control due to a change in the characteristic of the stage control.

COMPARATIVE EXAMPLE

Figure 14:
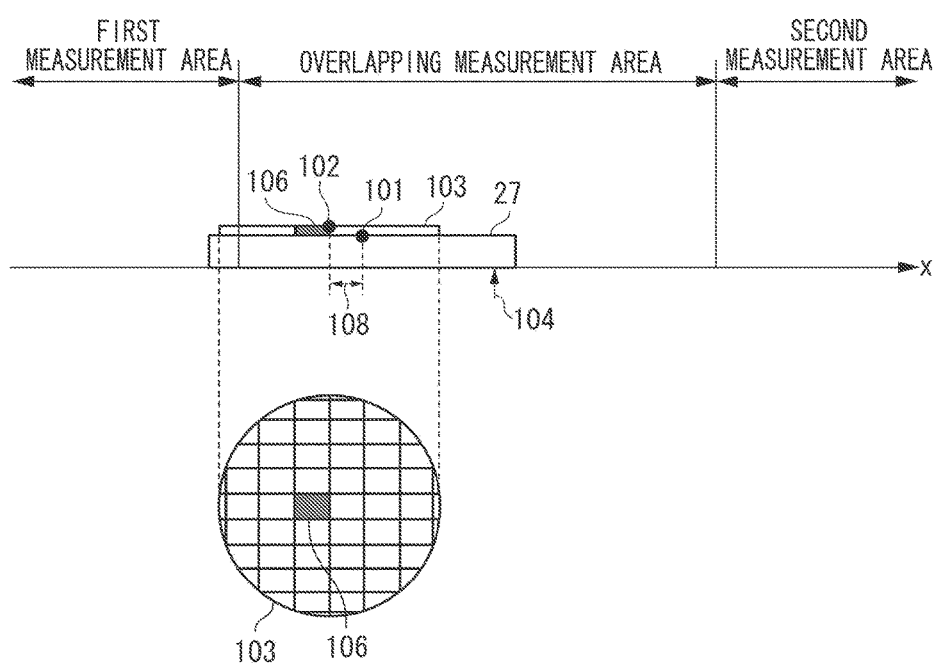
FIG. 14 is a diagram illustrating a stage position at the time of an exposure process according to a conventional technique.

FIG. 14 is a diagram illustrating a stage position during an exposure process according to a conventional technique. The same reference numerals as in FIG. 6 will be used. The exposure process of the shot 106 is performed with the top stage 27 in the position illustrated in FIG. 14. Since alignment offsets are reflected on the stage control, the top stage 27 is driven in the coordinate system with reference to the wafer origin 102. As compared to the case of FIG. 6, the position of the top stage 27 is shifted in the +X direction by the amount of deviation 108. In other words, the position of the top stage 27 changes by the alignment offsets between during the focus offset measurement and during the exposure process of the shot 106. According to the conventional technique, the position of the top stage 27 is located in the +X direction of the switching position 104 due to such a positional deviation. The stage position in the Z direction is thus measured by using the second measurement unit.

Figure 15:
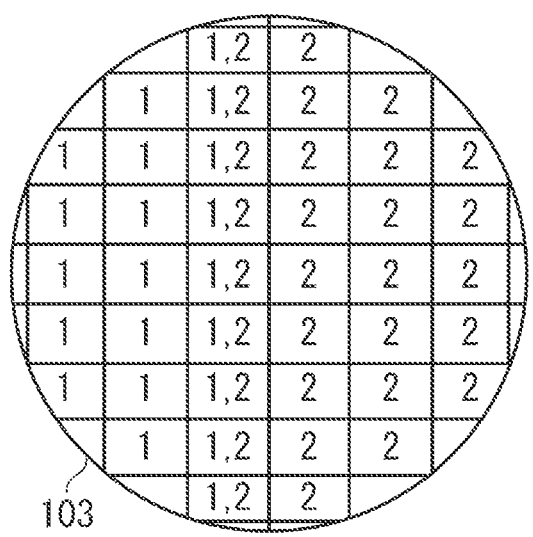
FIG. 15 is a diagram illustrating the numbers of the measurement units that measure respective shots according to the conventional technique.

FIG. 15 is a diagram illustrating the numbers of the measurement units that measure the respective shots. Shots marked with "1" represent ones that are measured by the first measurement unit. Shots marked with "2" represent ones that are measured by the second measurement unit. Shorts marked with "1, 2" represent ones that are measured by the first measurement unit during the focus offset measurement and by the second measurement unit during the exposure process. As described above, if the switching position of the measurement units is not changed, some of the shots are measured by using different measurement units in the focus measurement process and the exposure process.

As described above, according to the conventional technique, the focus measurement process and the exposure process on the same shot may use different measurement units for stage control. Depending on a difference in the characteristics of the respective measurement units, errors can thus occur in the measurement results. This has sometimes caused a change in the characteristic of the stage control with a decrease in the accuracy of the stage control.

An exposure apparatus according to a second exemplary embodiment will be described. Matters not mentioned here may adhere to the first exemplary embodiment. The first and second measurement units are similar to those of the first exemplary embodiment. The present exemplary embodiment describes a case where there is a plurality of switching positions for switching the measurement units. Suppose that the switching of the measurement units is controlled by one switching position as in the first exemplary embodiment. In such a case, if the top stage 27 stops near the switching position, the switching units can be frequently switched due to control deviations. The frequent switching of the measurement units makes the measurement values unstable and lowers the accuracy of the stage control. To suppress such a phenomenon, a plurality of switching positions can be provided in one direction. Note that even if the top stage 27 is in the same position, the measurement unit to measure the top stage 27 in the Z direction can be different depending on the moving direction of the top stage 27. If the same process is performed a plurality of times, the moving direction of the top stage 27 in performing the process on the same processing target may be different depending on the position of the top stage 27 when the previous process ends. This also applies to the focus measurement process and the exposure process described in the first exemplary embodiment. In the present exemplary embodiment, the alignment measurement process will be described.

A switching position 111 and a switching position 112 are made changeable so that the same measurement unit is used to perform the alignment measurement process on an alignment mark regardless of the moving direction of the top stage 27.

Figure 9:
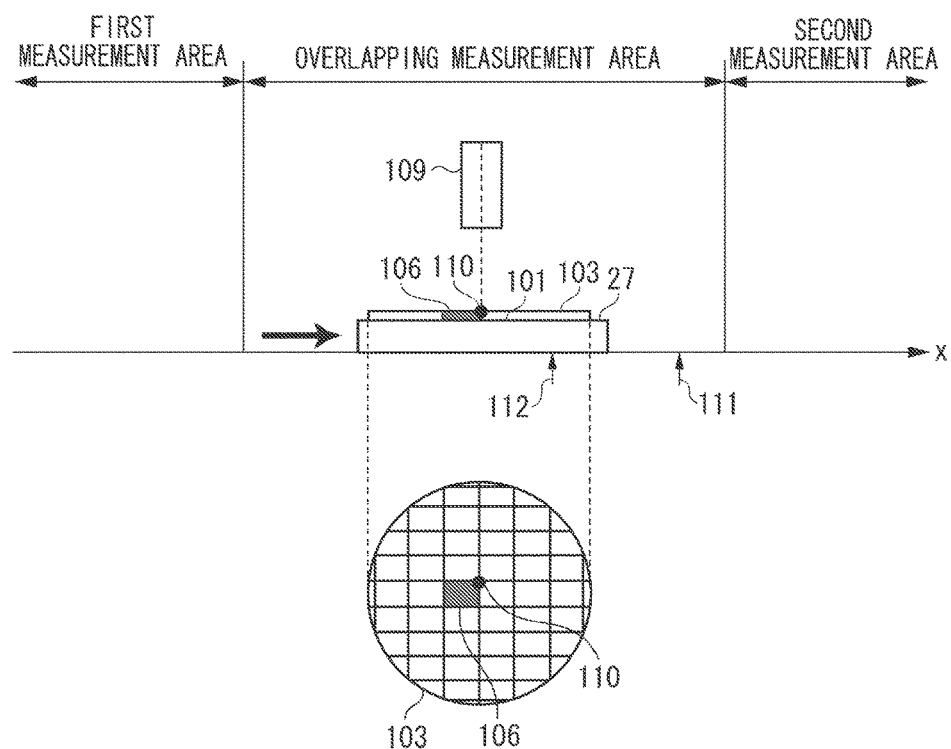
FIG. 9 is a diagram illustrating a stage position at the time of measuring an alignment mark when the top stage moves in a +X direction.

FIG. 9 is a diagram illustrating a stage position during an alignment mark measurement when the top stage 27 moves in the +X direction. The alignment scope 109 measures the position of an alignment mark 110 within the wafer surface. There is a plurality of alignment marks arranged within the wafer surface. The alignment mark 110 illustrated in FIG. 9 is one of the alignment marks. If the top stage 27 moves in the +X direction and the stage position in the Z direction is measured by the first measurement unit, the control unit 301 switches from the first measurement unit to the second measurement unit when the right end of the top stage 27 passes the switching position 111.

FIG. 9 illustrates the case where the top stage 27 moves in the +X direction and the stage position in the Z direction is measured by the first measurement unit. Since the right end of the top stage 27 is located in the −X direction of the switching position 111, the stage position in the Z direction is measured by the first measurement unit.

Figure 10:
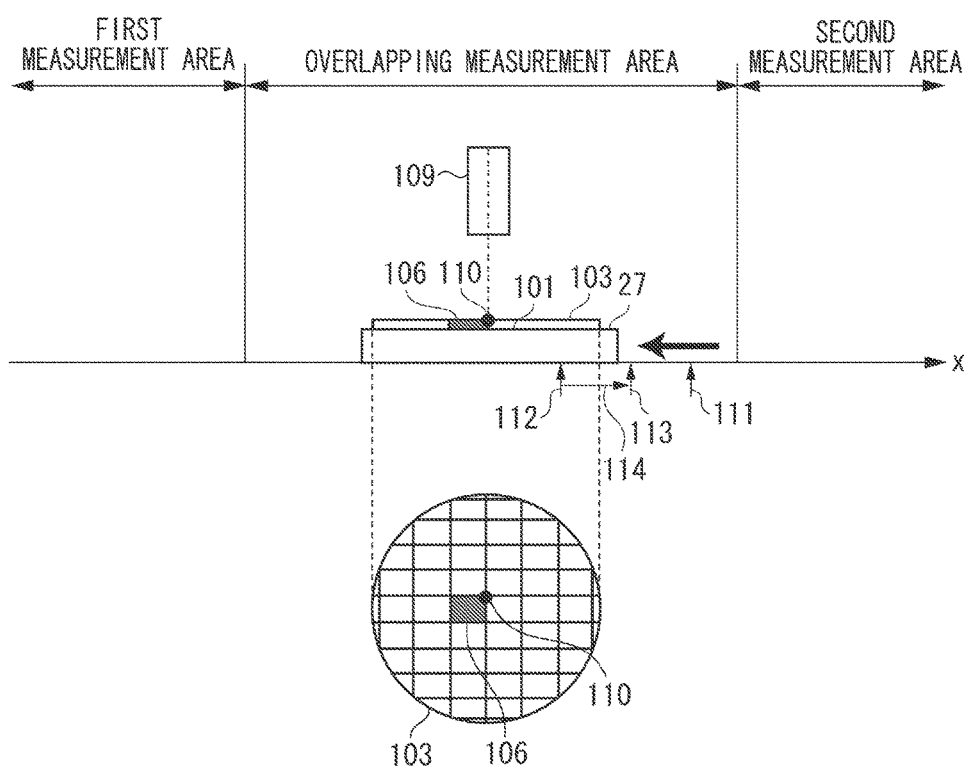
FIG. 10 is a diagram illustrating a stage position when the switching position is changed.

FIG. 10 is a diagram illustrating a stage position when the switching position is changed. The alignment scope 109 measures the position of the alignment mark 110 within the wafer surface. There is a plurality of alignment marks arranged within the wafer surface. The alignment mark 110 illustrated in FIG. 10 is one of the alignment marks. The alignment measurement process of the alignment mark 110 is performed with the top stage 27 in the position illustrated in FIG. 10. Since the right end of the top stage 27 is located in the +X direction of the switching position 112, the stage position in the Z direction is supposed to be measured by the second measurement unit. The switching position 112 is then changed to a switching position 113 so that the same measurement unit is used for the alignment mark 110 when the top stage 27 moves in the +X direction and when in the −X direction.

A distance 114 is the moving distance from the switching position 112 to the switching position 113. The switching position 113 moved from the switching position 112 by the distance 114 may be in the +X direction of the right end of the top stage 27 and in the −X direction of the switching position 111 when the alignment scope 109 measures the alignment mark 110. Here, the measurement unit used when the top stage 27 moves in the −X direction is described to be changed to the first measurement unit which is used when the top stage 27 moves in the +X direction. However, the measurement unit to be used when the top stage 27 moves in the +X direction may be changed to the second measurement unit that is used when the top stage 27 moves in the −X direction. In such a case, the switching position 111 is moved to a position in the −X direction of the right end of the top stage 27.

Similar to the first exemplary embodiment, information about the measurement units used for the respective alignment marks may be managed and the switching positions may be changed so that each alignment mark is processed by using the same measurement.

The present exemplary embodiment has dealt with the alignment measurement process. However, the present exemplary embodiment is not limited to the alignment measurement process and may be applied to the focus measurement process and the exposure process described in the first exemplary embodiment. The present exemplary embodiment may similarly be applied to a reference mark measurement process on a reference mark formed on a wafer stage such as the top stage 27. The position of the reference mark is detected via the projection unit 34 and/or the alignment scope 109 to measure the origin position of the wafer stage or a distance between the optical axis of the projection unit 34 and the alignment scope 109. Similar to the alignment measurement process, the same reference mark may be measured by using different measurement units depending on the moving direction of the wafer stage. Then, in the reference mark measurement process, the switching position of the measurement units can be moved to perform control so that the same measurement unit is used in the measurement process of the same reference mark. While the measurement units are described to use laser interferometers, other sensors such as a linear encoder and a capacitance sensor may be used.

Consequently, if the wafer stage moves in a plurality of directions in performing a process, the process on one processing target uses the same measurement unit for stage control. This can suppress a decrease in the accuracy of the stage control due to a change in the characteristic of the stage control.

COMPARATIVE EXAMPLE

Figure 16:
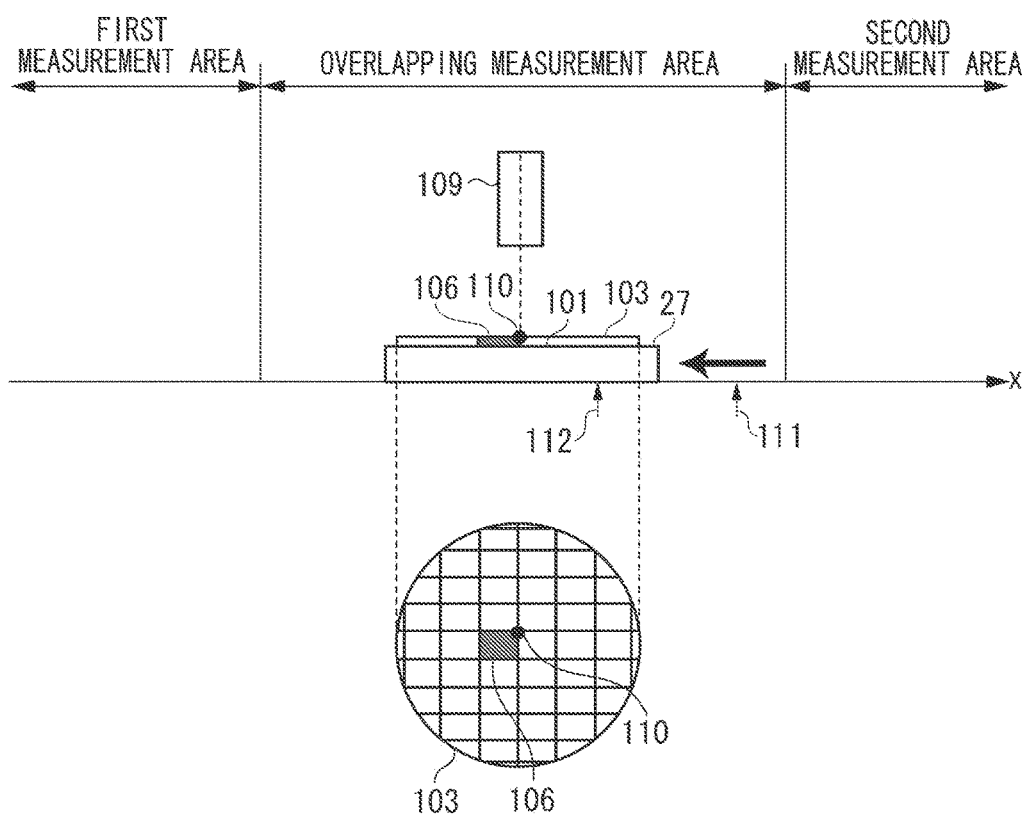
FIG. 16 is a diagram illustrating a stage position at the time of measuring an alignment mark when the top stage moves in a −X direction according to the conventional technique.

FIG. 16 is a diagram illustrating a stage position during an alignment mark measurement when the top stage 27 moves in the −X direction. The same reference numerals as in FIG. 9 are used. In FIG. 16, the top stage 27 is moving in the −X direction after the top stage 27 moves in the +X direction and the control unit 301 switches from the first measurement unit to the second measurement unit. According to the conventional technique, if the second measurement unit is used to measure the stage position in the Z direction, the control unit 301 switches from the second measurement unit to the first measurement unit when the right end of the top stage 27 moves in the −X direction and passes the switching position 112. In FIG. 16, the right end of the top stage 27 is located in the +X direction of the switching unit 112, and the stage position in the Z direction is measured by the second measurement unit.

As described above, according to the conventional technique, even in the alignment measurement process for measuring the same alignment mark with the top stage 27 in the same position, the stage control can be performed by using different measurement units depending on the moving direction of the top stage 27. Depending on a difference in the characteristics of the respective measurement units, errors can occur in the measurement results. This has sometimes caused a change in the characteristic of the stage control with a decrease in the accuracy of the stage control.

An exposure apparatus according to a third exemplary embodiment will be described. Matters not mentioned here may adhere to the first and second exemplary embodiments. The first and second measurement units are similar to those of the first exemplary embodiment. The third exemplary embodiment describes an example in which a process such as an exposure process is performed on a plurality of wafers having the same shot layout.

If the exposure process is performed on a plurality of wafers, corresponding shots, for examples, ones in the same positions on the wafers are desirably processed by using the same measurement unit. The reason is that a change in the characteristic of the stage control can be suppressed to reduce variations of the exposure results between the wafers.

If a plurality of wafers is processed, the amount of positional deviation between the wafer origin 102 and the stage origin 101 illustrated in FIG. 5 may vary from one wafer to another. The driving direction of the wafer stage (top stage 27) may vary from one wafer to another even in the same process. By the methods for making the switching position(s) of the first and second measurement units changeable as in the first and second exemplary embodiments, the same measurement unit may be unable to be used for the process on corresponding processing targets on different wafers.

The control unit 301 then switches the measurement units so that the same measurement unit is used for the process (exposure process) on corresponding shots between the plurality of wafers.

For that purpose, the control unit 301 reads information about the measurement units to be used for the shots from the memory 303, and switches the measurement units based on the information. The control unit 301 obtains the information about the measurement units used for the shots on the first wafer processed, and stores the information in the memory 303. Alternatively, the exposure apparatus illustrated in FIG. 1 may further include a keyboard, a mouse, and/or other input device (input unit), and the user may input the information about the measurement units to be used for the shots from the input device (not illustrated) and store the information in the memory 303. For example, as illustrated in FIG. 8, the information is that in which the numbers of the used measurement units are associated with the shots. The exposure apparatus may further include a not-illustrated communication device (communication unit) for performing electrical communication with an external apparatus via an electrical communication line, and obtain the information from a measurement apparatus, server, or other external apparatuses (not illustrated) connected via the electrical communication line and store the information in the memory 303. In any case, in steps S02 and S05 of FIG. 4, the control unit 301 reads the information about the measurement units to be used for the shots from the memory 303, and selects the measurement units to be used in the exposure process. In such a manner, the measurement units can be selected so that the same measurement unit is used in the exposure process of not only a shot on the same wafer but also corresponding shots on the wafers having the same shot layout. That is, the measurement units can be selected so that the same measurement unit is used for the processing of corresponding processing targets even between different wafers.

Consequently, the corresponding processing targets between different wafers are processed by using the same measurement unit for stage control. This can suppress a decrease in the accuracy of the stage control due to a change in the characteristic of the stage control.

An exposure apparatus according to a fourth exemplary embodiment will be described. Matters not mentioned here may adhere to the first, second, and third exemplary embodiments. The present exemplary embodiment describes a case where there is a plurality of laser interferometers for measuring the stage position in the Y direction.

Figure 11:
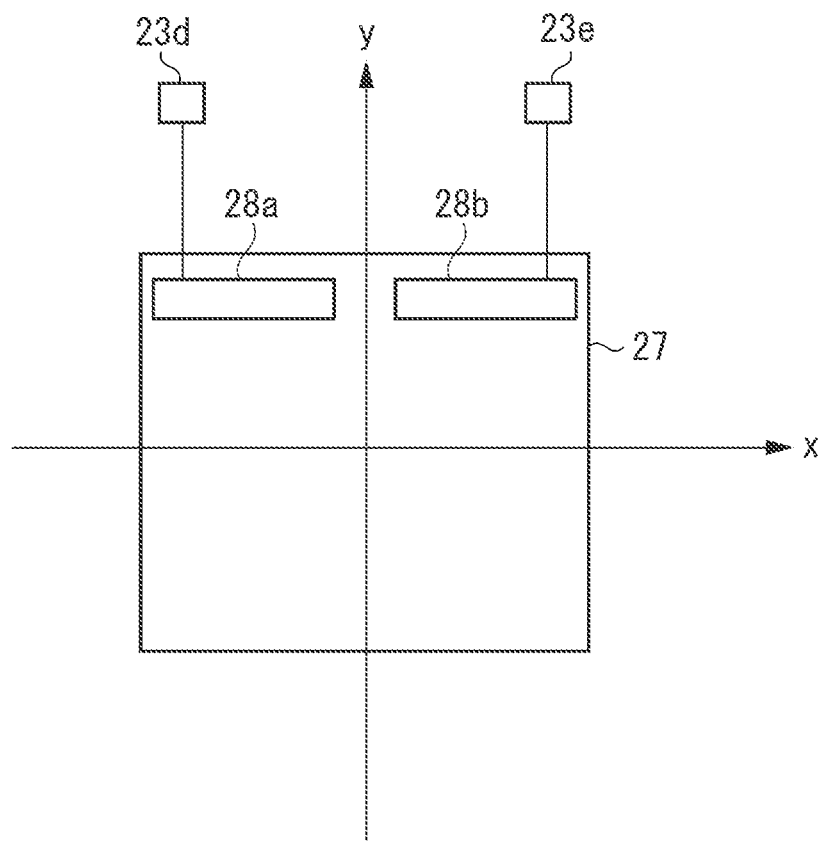
FIG. 11 is a diagram illustrating two laser interferometers for measuring a stage position in a Y direction.

FIG. 11 is a diagram illustrating two laser interferometers for measuring the stage position in the Y direction. Laser interferometers 23d and 23e are the two laser interferometers for measuring the stage position in the Y direction. Mirrors 28a and 28b are both mounted on the top stage 27. The laser interferometers 23d and 23e are arranged so that beams emitted from the laser interferometers 23d and 23e are horizontal to the XY plane, or configured so that the beams are guided to be horizontal by optical elements such as a mirror. The beams emitted from the respective laser interferometers 23d and 23e are made incident on the mirrors 28a and 28b each having a reflection surface perpendicular to the XY plane, whereby information about the position of the top stage 27 in the Y direction is obtained. Similar to the first exemplary embodiment, the two laser interferometers 23d and 23e have an overlapping measurement area. Similar to the first exemplary embodiment, the switching position is changed so that the same measurement unit (laser interferometer and reflecting mirror) is used in a plurality of processes performed on a processing target (such as a shot). The present exemplary embodiment is similarly applicable if a plurality of measurement units is configured not only in the Y direction but in the X direction as well. While the measurement units are described to use laser interferometers, other sensors such as a linear encoder and a capacitance sensor may be used.

Consequently, if a plurality of processes is performed, the processes on one processing target use the same measurement unit for stage control. This can suppress a decrease in the accuracy of the stage control due to a change in the characteristic of the stage control.

An exposure apparatus according to a fifth exemplary embodiment will be described. Matters not mentioned here may adhere to the first, second, third, and fourth exemplary embodiments. The present exemplary embodiment describes a case where a plurality of laser interferometers for measuring a plurality of stage positions is applied to a reticle stage.

Figure 12:
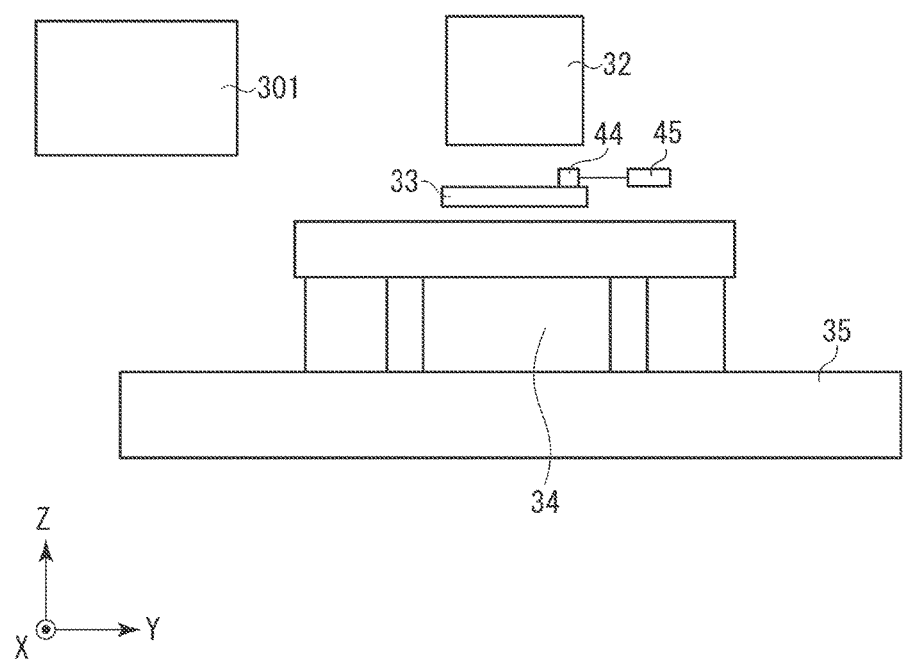
FIG. 12 is a diagram illustrating a reticle stage to which a plurality of laser interferometers is applied.
Figure 13:
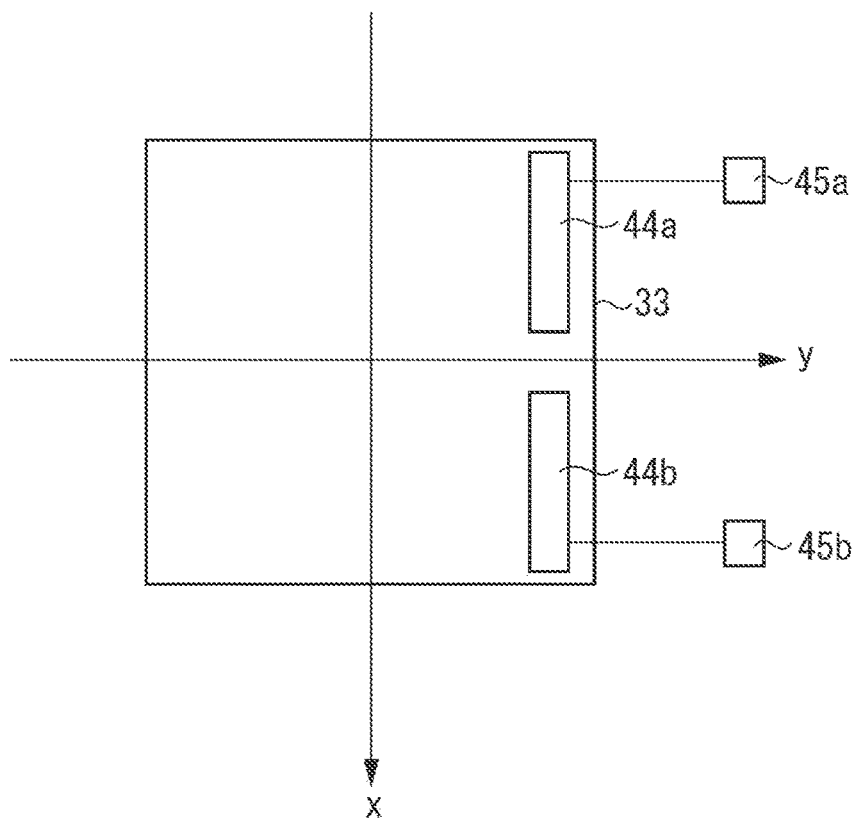
FIG. 13 is a diagram illustrating a top surface of the reticle stage to which the plurality of laser interferometers is applied.

FIG. 12 is a diagram illustrating the reticle stage to which the plurality of laser interferometers is applied. A laser interferometer 45 is one for measuring the position of the reticle stage 33 in the Y direction. A mirror 44 is mounted on the reticle stage 33. FIG. 13 is a diagram illustrating a top surface of the reticle stage 33 to which the plurality of laser interferometers is applied. There are two interferometers 45 and two mirrors 44, including laser interferometers 45a and 45b and mirrors 44a and 44b. The laser interferometers 45a and 45b are two laser interferometers for measuring the position of the reticle stage 33 in the Y direction. The mirrors 44a and 44b are both mounted on the reticle stage 33. Beams emitted from the respective laser interferometers 45a and 45b are made incident on the mirrors 44a and 44b each having a reflection surface perpendicular to the XY plane, whereby information about the position of the reticle stage 33 in the Y direction is obtained. Similar to the first exemplary embodiment, the two laser interferometers 45a and 45b have an overlapping measurement area. In performing a process for measuring a reticle mark on a reticle, the control unit 301 selects the measurement units so that the same measurement unit is used in the process for measuring the same or corresponding reticle mark(s). In a process for measuring a reference mark on the reticle stage 33, the control unit 301 selects the measurement units so that the same measurement unit is used in the process for measuring the same reference mark. The present exemplary embodiment may be similarly applied when a plurality of measurement units is configured not only in the Y direction but in the X and/or Z direction(s) as well. While the measurement units are described to use laser interferometers, other sensors such as a linear encoder and a capacitance sensor may be used.

Consequently, if a plurality of processes is performed, the processes on one processing target use the same measurement unit for stage control. This can suppress a decrease in the accuracy of the stage control due to a change in the characteristic of the stage control.

(Method for Manufacturing Product)

A method for manufacturing a product, such as a device (semiconductor device, magnetic recording medium, or liquid crystal display element), a color filter, and a hard disk, will be described. The manufacturing method includes a step of forming a pattern on a substrate (wafer, glass plate, or film-like substrate) by using a lithography apparatus (such as an exposure apparatus, an imprint apparatus, and a drawing apparatus). The manufacturing method further includes a step of processing the substrate on which the pattern is formed. Such a processing step may include a step of removing a residual film of the pattern. The processing step may further include other conventional steps such as a step of etching the substrate with the pattern as a mask. As compared to conventional methods, the method for manufacturing a product according to the present exemplary embodiment is advantageous in terms of at least one of performance, quality, productivity, and production cost of the product.

The exemplary embodiments of the present disclosure have been described above. It will be understood that the present disclosure is not limited to such exemplary embodiments, and various changes and modifications may be made within the scope of the gist thereof. For example, the lithography apparatus is not limited to an exposure apparatus that exposes a substrate to form a pattern. The lithography apparatus may be a drawing apparatus that forms a pattern on a substrate by performing drawing on the substrate by using a charged particle beam (such as an electron beam and an ion beam) via a charged particle optical system. The lithography apparatus may be an imprint apparatus that forms a pattern on a substrate by forming (molding) an imprint material (such as resin) on the substrate by using a mold (original). An exemplary embodiment of the present disclosure may further be applied to not only a lithography apparatus but an apparatus that includes a stage for holding an original or a substrate and the performance of which is affected by the accuracy of stage control. The exposure apparatuses according to the first, second, third, fourth, and fifth exemplary embodiments may be carried out not only by themselves but in combinations.

According to an exemplary embodiment of the present disclosure, a lithography apparatus, a pattern formation method, and a method for manufacturing a product which suppress a decrease in the accuracy of stage control can be provided.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2015-178949, filed Sep. 10, 2015, which is hereby incorporated by reference herein in its entirety.

What is claimed is:

1. A lithography apparatus that forms a pattern on a substrate, the lithography apparatus comprising:
- a moving unit configured to move with an original or the substrate mounted thereon;
- a plurality of measurement units configured to obtain information about a position of the moving unit, measurement areas of the respective measurement units overlapping each other; and
- a control unit configured to obtain an amount of positional deviation between the original or the substrate mounted on the moving unit and the moving unit based on a position of a mark formed on the original or the substrate and switch the measurement units used to obtain the information about the position of the moving unit, based on a switching position lying in an overlapping measurement area,
- wherein, in a case where a first process and a second process that is performed after the first process are performed on one of a plurality of processing targets on the original or on the substrate, the control unit controls the moving unit with reflecting the obtained amount of the positional deviation after the first process is performed, changes the switching position based on the obtained amount of the positional deviation after the first process is performed and controls the measurement units so that the same one of the measurement units is used in performing the first and the second processes.

2. The lithography apparatus according to claim 1, wherein the control unit changes the switching position based on information about the measurement unit used for the one processing target and controls the measurement units so that the same measurement unit is used.

3. The lithography apparatus according to claim 2, wherein the control unit stores the information about the measurement unit in a storage unit.

4. The lithography apparatus according to claim 1, wherein the processing target is any one of a shot on the substrate, an alignment mark formed on the substrate, and a reference mark formed on the moving unit on which the substrate is mounted.

5. The lithography apparatus according to claim 4, wherein the first process is one of a focus measurement process, a substrate process, a measurement process of a result of the substrate process, an alignment measurement process, and a reference mark measurement process and the second process is another one of the focus measurement process, the substrate process, the measurement process of a result of the substrate process, the alignment measurement process, and the reference mark measurement process.

6. The lithography apparatus according to claim 1, wherein the processing target is either an alignment mark formed on the original or a reference mark formed on the moving unit on which the original is mounted.

7. The lithography apparatus according to claim 6, wherein the first process is one of an alignment measurement process or a reference mark measurement process and the second process is another one of the alignment measurement process or the reference mark measurement process.

8. The lithography apparatus according to claim 1, further comprising a scope configured to measure the positon of the mark formed on the substrate or the original mounted on the moving unit,
wherein the control unit is configured to obtain the amount of the positional deviation based on the position of the mark measured by the scope.

9. A pattern forming method for forming a pattern on a substrate using a lithography apparatus, the method comprising:
moving a moving unit of the lithography apparatus with an original or the substrate mounted thereon;
obtaining information about a position of the moving unit by a plurality of measurement units of the lithography apparatus, measurement areas of the respective measurement units overlapping each other;
obtaining an amount of positional deviation between the original or the substrate mounted on the moving unit and the moving unit based on a position of a mark formed on the original or the substrate; and
switching the measurement units used to obtain the information about the position of the moving unit, based on a switching position lying in an overlapping measurement area,
wherein, in a case where a first process and a second process that is performed after the first process are performed on one of a plurality of processing targets on the original or on the substrate, the moving unit is controlled with reflecting the obtained amount of the positional deviation after the first process is performed, the switching position is changed based on the obtained amount of the positional deviation after the first process is performed and the measurement units are controlled so that the same one of the measurement units is used in performing the first and second processes.

10. A method for manufacturing a product, the method comprising:
forming a pattern on a substrate by using a lithography apparatus; and
processing the substrate on which the pattern is formed by the forming step,
wherein the lithography apparatus includes
a moving unit configured to move with an original or the substrate mounted thereon,
a plurality of measurement units configured to obtain information about a position of the moving unit, measurement areas of the respective measurement units overlapping each other, and
a control unit configured to obtain an amount of positional deviation between the original or the substrate mounted on the moving unit and the moving unit based on a position of a mark formed on the substrate or the original and switch the measurement units used to obtain the information about the position of the moving unit, based on a switching position lying in an overlapping measurement area, and
wherein, in a case where a first process and a second process is performed after the first process are performed on one of a plurality of processing targets on the original or on the substrate, the control unit controls the moving unit with reflecting the obtained amount of the positional deviation after the first process is performed, changes the switching position based on the obtained amount of the positional deviation after the first process is performed and controls the measurement units so that the same one of the measurement units is used in performing the first and second processes.

11. A lithography apparatus that forms a pattern on a substrate, the lithography apparatus comprising:
a moving unit configured to move with an original or the substrate mounted thereon;
a plurality of measurement units configured to obtain information about a position of the moving unit, measurement areas of the respective measurement units overlapping each other; and
a control unit configured to obtain an amount of positional deviation between the original or the substrate mounted on the moving unit and the moving unit based on a position of a mark formed on the original or the substrate and switch the measurement units used to obtain the information about the position of the moving unit, based on a first switching position lying in an overlapping measurement area and a second switching position, lying in the overlapping measurement area, different from the first switching positon,
wherein the control unit switches the measurement units based on the first switching position while the moving unit moves in a first direction and switches the measurement units based on the second switching position while the moving unit moves in a second direction different from the first direction,
wherein, in a case where the moving unit moves in the first and second directions in performing a process on a plurality of processing targets on the original, on the substrate, or on the moving unit, the control unit changes the second switching position based on the positon of the moving unit while the moving unit moves in the second direction after the moving unit moves in the first direction and controls the measurement units so that the same one of the measurement units is used in performing the process on one of the processing targets when the moving unit moves in the first and the second directions.

12. The lithography apparatus according to claim 11, further comprising a scope configured to measure the positon of the mark formed on the substrate or the original mounted on the moving unit,
wherein the control unit is configured to obtain the amount of the positional deviation based on the position of the mark measured by the scope.

13. A pattern forming method for forming a pattern on a substrate using a lithography apparatus, the method comprising:
moving a moving unit of the lithography apparatus with an original or the substrate mounted thereon;
obtaining information about a position of the moving unit by a plurality of measurement units of the lithography apparatus, measurement areas of the respective measurement units overlapping each other;
obtaining an amount of positional deviation between the original or the substrate mounted on the moving unit and the moving unit based on a position of a mark formed on the original or the substrate; and
switching the measurement units used to obtain the information about the position of the moving unit, based on a first switching position lying in an overlapping measurement area and a second switching position, lying in the overlapping measurement area, different from the first switching positon,
wherein the measurement units are switched based on the first switching position while the moving unit moves in a first direction and switches the measurement units based on the second switching position while the moving unit moves in a second direction different from the first direction,
wherein, in a case where the moving unit moves in the first and second directions in performing a process on a plurality of processing targets on the original, on the substrate, or on the moving unit, the switching position is changed based on the positon of the moving unit while the moving unit moves in the second direction after the moving unit moves in the first direction and the measurement units are controlled so that the same one of the measurement units is used in performing of the process on one of the processing targets when the moving unit moves in the first direction and when the moving unit moves in the second direction.

14. A method for manufacturing a product, the method comprising:
forming a pattern on a substrate by using a lithography apparatus; and
processing the substrate on which the pattern is formed by the forming step,
wherein the lithography apparatus includes
a moving unit configured to move with an original or the substrate mounted thereon,
a plurality of measurement units configured to obtain information about a position of the moving unit, measurement areas of the respective measurement units overlapping each other, and
a control unit configured to obtain an amount of positional deviation between the original or the substrate mounted on the moving unit and the moving unit based on a position of a mark formed on the original or the substrate and switch the measurement units used to obtain the information about the position of the moving unit, based on a first switching position lying in an overlapping measurement area and a second switching position, lying in the overlapping measurement area, different from the first switching positon,
wherein the control unit switches the measurement units based on the first switching position while the moving unit moves in a first direction and switches the measurement units based on the second switching position while the moving unit moves in a second direction different from the first direction,
wherein, in a case where the moving unit moves in the first and second directions in performing a process on a plurality of processing targets on the original, on the substrate, or on the moving unit, the control unit changes the second switching position based on the positon of the moving unit while the moving unit moves in the second direction after the moving unit moves in the first direction and controls the measurement units so that the same one of the measurement units is used in performing the process on one of the processing targets when the moving unit moves in the first direction and when the moving unit moves in the second direction.

* * * * *